United States Patent
Kawaguchi (10) Patent No.: US 7,875,875 B2
(45) Date of Patent: Jan. 25, 2011

(54) SEMICONDUCTOR DEVICE AND MANUFACTURING METHOD THEREOF

(75) Inventor: Kenichi Kawaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/450,280

(22) Filed: Jun. 12, 2006

(65) Prior Publication Data
US 2007/0210300 A1    Sep. 13, 2007

(30) Foreign Application Priority Data
Mar. 7, 2006    (JP)    ............... 2006-060532

(51) Int. Cl.
*H01L 31/00*    (2006.01)
(52) U.S. Cl. .................. 257/14; 257/9; 257/E33.008
(58) Field of Classification Search ............... 257/14
See application file for complete search history.

(56) References Cited

U.S. PATENT DOCUMENTS

2007/0221908 A1 *  9/2007  Takahashi et al. ............ 257/13

FOREIGN PATENT DOCUMENTS

| JP | 2003-197900 | 7/2003 |
| JP | 2004-87749 | 3/2004 |
| JP | 2004-111710 | 4/2004 |
| JP | 2005-294510 | * 10/2005 ................. 257/13 |

OTHER PUBLICATIONS

JP 2005-294510 {machine's translation}, date of publication: Oct. 20, 2005.*

* cited by examiner

*Primary Examiner*—Thanh V Pham
*Assistant Examiner*—Tony Tran
(74) *Attorney, Agent, or Firm*—Kratz, Quintos & Hanson, LLP (57) ABSTRACT

A quantum dot semiconductor device securing sufficient gains without depending on polarization and a manufacturing method thereof. On a first barrier layer, a multilayer quantum dot is formed by repeatedly stacking alternately a quantum dot layer and a second barrier layer. On a quantum dot layer as an uppermost layer of the quantum dot, a third barrier layer which keeps local strains in the quantum dot layer is formed. On the third barrier layer, a fourth barrier layer which compensates compressive strains from the second barrier layer is formed. Therefore, the fourth barrier layer made of tensile strain materials compensates accumulation of compressive strains caused by stacking of a multilayer quantum dot layer. The third barrier layer prevents tensile strains in the fourth barrier layer from directly impacting on the quantum dot layer, so that local strains can be effectively cancelled. Thus, the above-described semiconductor device can be realized.

11 Claims, 6 Drawing Sheets

SEMICONDUCTOR DEVICE AND MANUFACTURING METHOD THEREOF

CROSS-REFERENCE TO RELATED APPLICATIONS

This application is based upon and claims the benefits of priority from the prior Japanese Patent Application No. 2006-060532, filed on Mar. 7, 2006, the entire contents of which are incorporated herein by reference.

BACKGROUND OF THE INVENTION

1. Field of the Invention

The present invention relates to a semiconductor device and a method for manufacturing the same. More particularly, the present invention relates to a quantum dot semiconductor device and a method for manufacturing the same.

2. Description of the Related Art

Recently, a technology of using quantum dots for a gain medium is proposed for high-performance of optical communication devices. Such a device is expected to be applied particularly to a semiconductor amplifier using a broad band property due to inhomogeneous broadening of quantum dots, which serves as a repeater of a wavelength multiplexing communication system.

To employ quantum dots for a semiconductor device, it is required that for a light with a variable polarization direction such as a light passing through an optical fiber, sufficient gains are secured without depending on polarization of a signal light. Therefore, in order to obtain a quantum dot structure securing sufficient gains without depending on polarization of a light, a height of the quantum dot must be set to the same size as that in the horizontal direction of the quantum dot. For one of such shapes, there has been proposed a columnar quantum dot in which a plurality of flat-shaped quantum dots self-formed by the Stranski-Krastanov (S-K) growth mode are stacked almost at intervals of being coupled quantum mechanically.

However, it is confirmed that when columnar quantum dots are stacked by a spacer layer with a film thickness of about 40 nm capable of stacking of ordinary quantum dots, crystallinity deteriorates and therefore, photoluminescence intensity decreases. Deterioration of the crystallinity is caused by the following factor. That is, the columnar quantum dots undergo compressive strains so as to achieve a lattice matching with a substrate. Further, the strains are accumulated in proportion to the stacking number. As a result, a thickness of the accumulated strains is excessively increased to exceed a film thickness capable of growth (critical film thickness) and therefore, strain relaxation with generation of dislocation is generated in a crystal.

Figure 6:
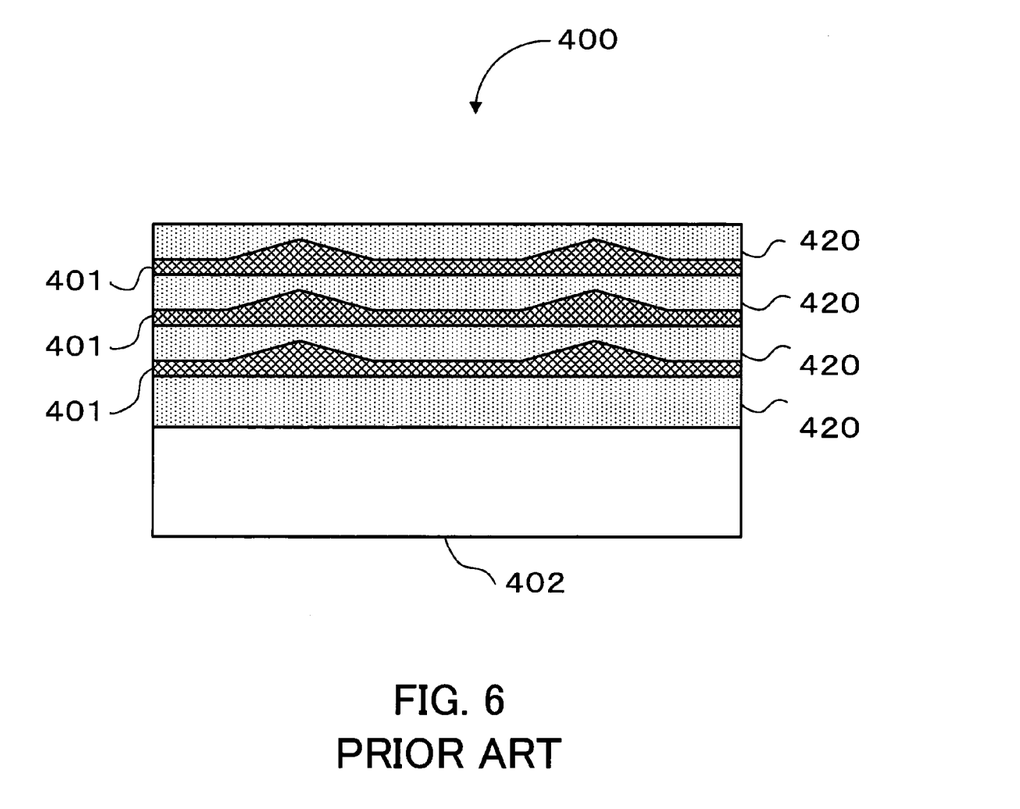
FIG. 6 is a constitution diagram of a columnar quantum dot.

Accordingly, a quantum dot having a structure as shown in the following FIG. 6 is proposed as a method for preventing deterioration of the crystallinity due to the stacking of quantum dots (see, e.g., Japanese Unexamined Patent Application Publication No. 2003-197900). FIG. 6 is a constitution diagram of a columnar quantum dot. A columnar quantum dot 400 of FIG. 6 employs a strain compensation structure in which on a substrate 402, a quantum dot layer 401 and a barrier layer 420 made of materials with a strain property are alternately stacked several times. The strain compensation structure is proposed for a general columnar quantum dot.

However, when the strain compensation structure is applied, the barrier layer made of materials with a strain property covers the quantum dot also at the part contacting the quantum dot. As a result, the barrier layer compensates residual strains in the whole crystal as well as changes a local strain distribution within the quantum dot. The local strains within the quantum dot are a factor for determining a polarization characteristic and a photoluminescence wavelength. Therefore, there is a problem that a polarization characteristic and a polarization wavelength are inappropriately changed due to change of the strain distribution within the quantum dots.

SUMMARY OF THE INVENTION

In view of the foregoing, it is an object of the present invention to provide a quantum dot semiconductor device having good crystallinity and securing sufficient gains without depending on polarization, and a method for manufacturing the same.

To accomplish the above objects, according to one aspect of the present invention, there is provided a quantum dot semiconductor device. The semiconductor device comprises: a semiconductor substrate; and a quantum dot structure formed on the substrate, the quantum dot structure comprises: a multilayer quantum dot formed on a first barrier layer, in which quantum dot layers are stacked through a second barrier layer; a third barrier layer formed on a quantum dot layer as an uppermost layer of the multilayer quantum dot, which keeps local strains in the quantum dot layer as the uppermost layer; and a fourth barrier layer formed on the third barrier layer, which compensates residual strains in the multilayer quantum dot.

According to another aspect of the present invention, there is provided a method for manufacturing a quantum dot semiconductor device. The method comprises the steps of: forming on a first barrier layer a multilayer quantum dot in which quantum dot layers are stacked through a second barrier layer; forming on a quantum dot layer as an uppermost layer of the formed multilayer quantum dot a third barrier layer which keeps local strains in the quantum dot layer as the uppermost layer; and forming on the formed third barrier layer a fourth barrier layer which compensates residual strains in the multilayer quantum dot.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiments of the present invention will be described in detail below with reference to the accompanying drawings, wherein like reference numerals refer to like elements throughout.

Figure 1:
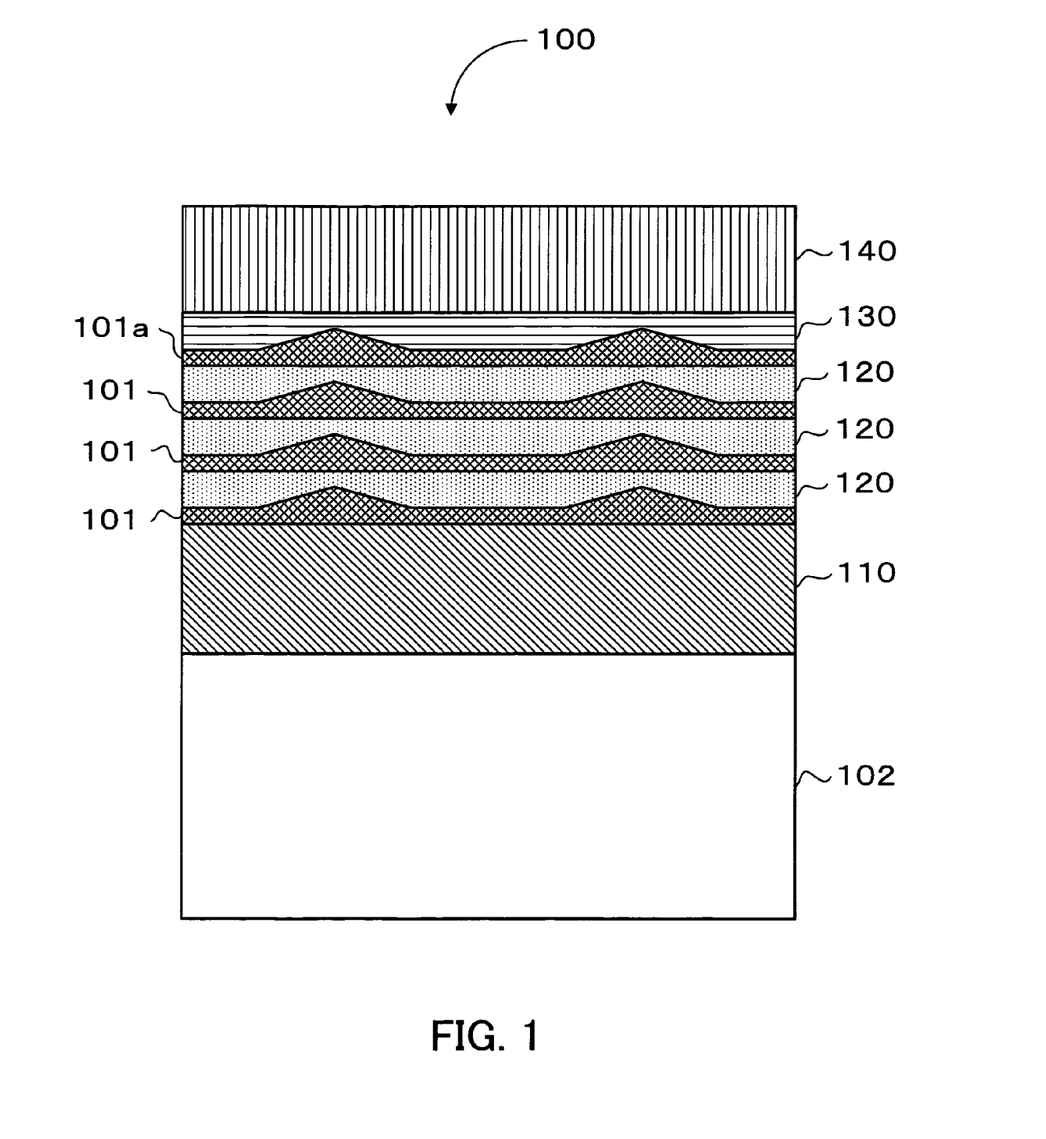
FIG. 1 is a constitution example of a quantum dot structure.

FIG. 1 is a constitution example of a quantum dot structure. In a quantum dot structure 100 in FIG. 1, a first barrier layer 110 is stacked on a substrate 102, if necessary, through a buffer layer. Further, a columnar quantum dot formed by repeatedly stacking alternately a quantum dot layer 101 and a second barrier layer 120 three times and then stacking a quantum dot layer 101a on the uppermost layer is stacked on the first barrier layer 110. Subsequently, a third barrier layer 130 made of compressive strain materials and a fourth barrier layer 140 made of tensile strain materials are stacked as a spacer layer. The quantum dot layers 101 and 101a have the same property. As described above, the quantum dot structure 100 in FIG. 1 has a structure such that in the stacking of the columnar quantum dot, the spacer layer is formed by a two-layer structure in which starting from the bottom, the third barrier layer 130 and the fourth barrier layer 140 are sequentially stacked on the columnar quantum dot.

Accumulation of compressive strains caused by the stacking of the quantum dot layers 101 and 101a and second barrier layers 120, which constitute the columnar quantum dot, is compensated by the fourth barrier layer 140 made of tensile strain materials. On the other hand, the third barrier layer 130 provided in contact with an upper surface of the quantum dot layer 101a is a layer for preventing tensile strains in the fourth barrier layer 140 from directly impacting on the quantum dot layer 101a. Therefore, even if the third barrier layer 130 is formed by a layer made of no-strain materials, a sufficient effect can be obtained. However, since propagation of local strains to an upper layer is inversely proportional to a film thickness, when the third barrier layer 130 is thin, a layer made of compressive strain materials is used for forming the layer 130. As a result, local strains can be effectively cancelled.

Further, it is known that a critical film thickness of the columnar quantum dot is determined by the sum of the product of a strain amount and film thickness in each layer. Accordingly, when the second barrier layer 120 is made of tensile strain materials, the strain amount of the fourth barrier layer 140 can be reduced. Therefore, band discontinuity caused by a difference in the strain amount between the third barrier layer 130 and the fourth barrier layer 140 can be reduced. As a result, when materials with the same band gap are used for forming the third barrier layer 130 and the fourth barrier layer 140, useless carriers are prevented from staying in the third barrier layer 130 and the fourth barrier layer 140, so that carriers can be evenly injected into the quantum dot layers 101 and 101a.

When repeatedly stacking on the fourth barrier layer 140 the columnar quantum dot formed by repeatedly stacking alternately the quantum dot layer 101 and the second barrier layer 120 on the first barrier layer 110 and then stacking the quantum dot layer 101a on the uppermost layer, the gains can be improved.

Figure 2:
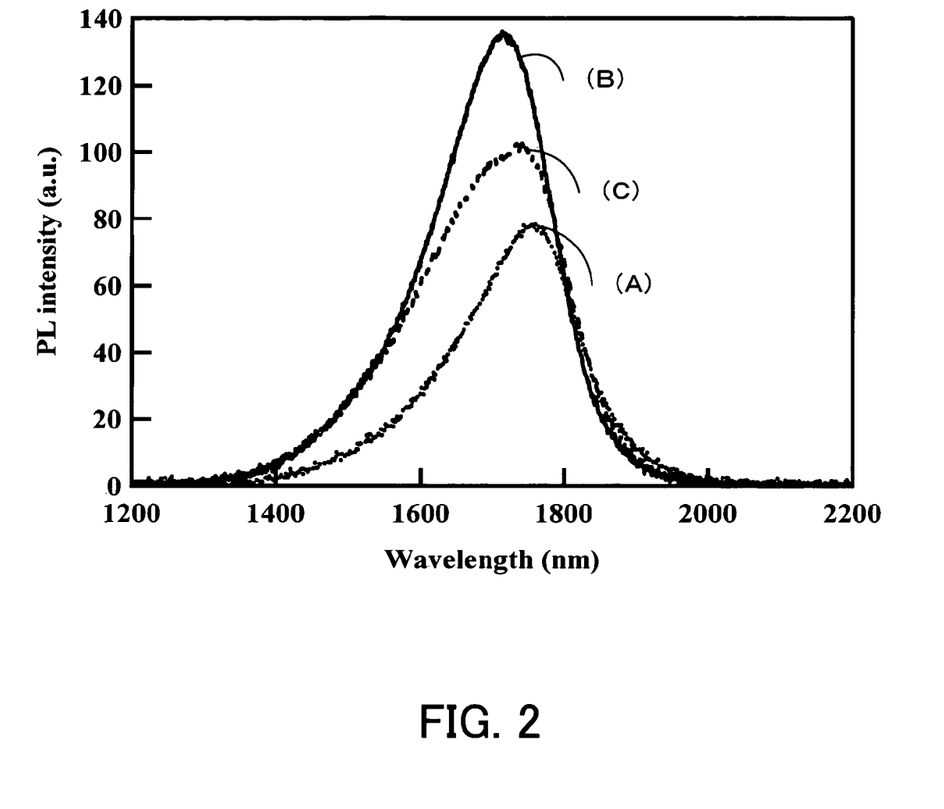
FIG. 2 is an experimental result showing an effect of a quantum dot structure.

FIG. 2 is an experimental result showing an effect of a quantum dot structure. In FIG. 2, a horizontal axis represents a wavelength and a vertical axis represents a photoluminescence intensity. (A), (B) and (C) in FIG. 2 are as follows. In the experiment of FIG. 2, two types of semiconductor devices are manufactured using the following materials and the PL intensity is measured in each case. Indium phosphorus (InP (001)) is used as a substrate and indium phosphorus (thickness: 100 nm) is used as a buffer layer. Indium gallium arsenide phosphorus (InGaAsP) (thickness: 50 nm) is grown as a first barrier layer. On the first barrier layer, indium arsenide (InAs) as a quantum dot layer and InGaAsP (in terms of the flat film thickness: 0.8 nm) as a second barrier layer are repeatedly stacked alternately seven times to form a columnar quantum dot (sevenfold columnar quantum dot). Further, using InGaAsP with a thickness of 40 nm as a spacer layer, the columnar quantum dot is stacked four times to form a stacked columnar quantum dot structure. In the structure, a comparison is made between a case (A) where the spacer layer is composed of only a layer made of no-strain material and a case (B) where the spacer layer is composed of two layers including a third barrier layer made of no-strain materials (thickness: 10 nm) and a fourth barrier layer made of tensile strain materials (the strain amount: −0.5%, thickness: 20 nm). For a sign of the strain amount, a plus sign (+) is used in a case of compressive strains and a minus sign (−) is used in a case of tensile strains. Further, also the PL intensity in a case (C) where the columnar quantum dot is a single-layer sevenfold columnar quantum dot (hereinafter, referred to as a single layer) is shown for comparison. From FIG. 2, the following facts are found. In the case of (A), the crystallinity deteriorates by the accumulation of strains due to the stacking as described above and therefore, the PL intensity more decreases than that in the case of (C). However, in the case of (B), the PL intensity is improved as compared with the case of (C). From the improvement of the PL intensity in the case of (B), it can be confirmed that high crystallinity is obtained by the formation of the third barrier layer and the fourth barrier layer in the stacked columnar quantum dot structure.

Figure 3:
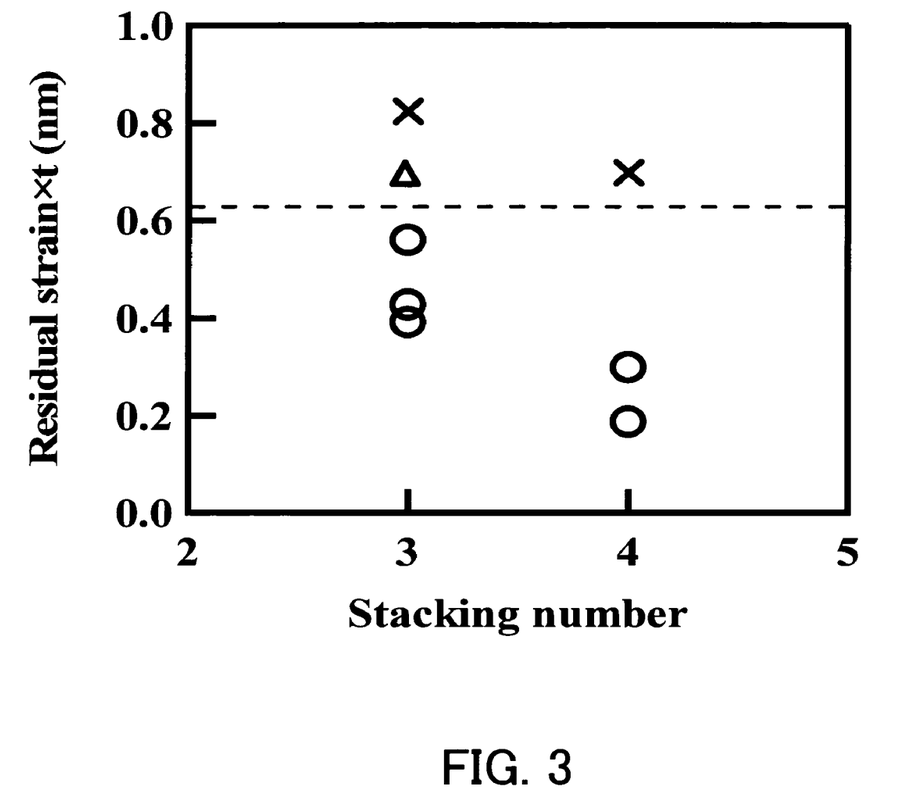
FIG. 3 shows an evaluation result on residual strain energy in a quantum dot structure.

FIG. 3 shows an evaluation result on residual strain energy in a quantum dot structure. In FIG. 3, a horizontal axis represents the stacking number of the quantum dot structures and a vertical axis represents the product of the strain amount and the film thickness. In the quantum dot structure 100, the direction of strains in each layer is important in principle and an effect of a strain compensation structure is exerted regardless of the film thickness and strain amount in each layer. Therefore, in order to obtain a particularly high effective strain compensation structure from a relationship between the film thickness or the strain amount and the strain compensation structure, the columnar quantum dot structures which are different in the stacking number of and residual strains in the quantum dot structures are manufactured. Further, the crystallinity thereof is evaluated. The residual strain energy per unit area can be determined by the product of the strain amount of the quantum dot to the substrate and the film thickness (nm) in terms of the flat film thickness of the quantum dot and by the product of the strain amount and film thickness (nm) of the barrier layer. In FIG. 3, a mark ○ indicates a columnar quantum dot structure in which no deterioration of the crystallinity is found, a mark Δ indicates a structure showing the PL intensity equal to that of a single-layer columnar quantum dot although being affected by stacking, and a mark X indicates a structure showing the PL intensity lower than that of the single-layer columnar quantum dot. From FIG. 3, it is confirmed that a structure under conditions that the evaluation result of the residual strain energy per unit area satisfies 0.62 or less is particularly preferable. For an evaluation example of the residual strain energy per unit area, calculation is performed below on the structure showing an improvement of the PL property in FIG. 2. In the structure, the strain amount of the InAs quantum dot to the InP substrate is 0.0312, the film thickness of the quantum dot is 0.8 nm in terms of a flat film thickness, the strain amount of the second barrier layer is 0, the film thickness of the second barrier layer is 0.8 nm in terms of a flat film thickness, the number of layers in the columnar quantum dot is 7, the strain amount of the fourth barrier layer is −0.0005, the film thickness of the fourth barrier layer is 20 nm and the stacking number of the columnar quantum dots is 4. Therefore, the evaluation result of the residual strain energy per unit area is as follows:

$$\{(0.0312 \times 0.8 + 0 \times 0.8) \times 7 + (-0.0005 \times 20)\} \times 4 = 0.299 < 0.62.$$

The quantum dot structure 100 having the above-described structure can be formed using the following method and materials. For example, using a (Metalorganic Vapor-Phase Epitaxy: MOCVD) method, the quantum dot structure 100 is formed as follows. That is, the InP (100) substrate 102 is placed in a reaction chamber and heated to 600° C. to 650° C. at 50 Torr in a phosphine ($PH_3$) atmosphere. After the temperature becomes stable, trimethyl indium (TMIn) is supplied while supplying $PH_3$, whereby the InP buffer layer is grown to a thickness of 100 nm. Thereafter, the substrate temperature is lowered to 480° C. to 550° C. in a $PH_3$ atmosphere. After the temperature becomes stable, TMIn, triethyl gallium (TEGa) and arsine ($AsH_3$) are supplied while supplying $PH_3$, whereby an $In_xGa_{1-x}As_{1-y}P_y$ layer as the first barrier layer 110 is grown to a thickness of 100 nm. The composition of the $In_xGa_{1-x}As_{1-y}P_y$ layer as the first barrier layer 110 is set, for example, to x=0.85 and y=0.67 to thereby form a barrier layer showing no strain at a wavelength of 1.1 μm.

Thereafter, the substrate temperature is lowered to 430° C. to 450° C. After the temperature becomes stable, TMIn and $AsH_3$ are supplied to thereby form an InAs layer as the quantum dot layer. The supply conditions may be determined as follows. For example, the flow rate of the group III material (TMIn) is set such that the supply ratio of the group V material relative to the group III material (or V/III ratio) is 5 to 20. Further, the group III material equivalent to 1 to 4 ML in terms of a flat layer thickness is supplied. Thereby, the quantum dot layers 101 and 101*a* with a height of 1 to 3 nm are formed. After the formation of the quantum dot layers 101 and 101*a*, TMIn, TEGa, $AsH_3$ and $PH_3$ are supplied, whereby an $In_xGa_{1-x}As_{1-y}P_y$ layer as the second barrier layer 120 is grown, for example, to a thickness of 1 nm. The composition of the $In_xGa_{1-x}As_{1-y}P_y$ layer as the second barrier layer 120 is set, for example, to x=0.66 and y=0.56 to thereby form a barrier layer with tensile strains of 1% at a wavelength of 1.1 μm.

Thereafter, the quantum dot layers 101 and 101*a* and the second barrier layer 120 are repeatedly grown, thereby forming a columnar quantum dot. After the columnar quantum dot is formed, an $In_xGa_{1-x}As_{1-y}P_y$ layer as the third barrier layer is grown, for example, to a thickness of 10 nm. The composition of the $In_xGa_{1-x}As_{1-y}P_y$ layer as the third barrier layer is set, for example, to x=0.85 and y=0.67 to thereby form a barrier layer showing no strain at a wavelength of 1.1 μm. Thereafter, the substrate temperature is raised up to 480° C. in a $PH_3$ atmosphere. Thereafter, an $In_xGa_{1-x}As_{1-y}P_y$ layer as the fourth barrier layer 140 is grown, for example, to a thickness of 20 nm. The composition of the $In_xGa_{1-x}As_{1-y}P_y$ layer as the fourth barrier layer 140 is set, for example, to x=0.75 and y=0.62 to thereby form a barrier layer with tensile strains of 0.5% at a wavelength of 1.1 μm. By repeating the steps, a stacked columnar quantum dot with a film thickness of 40 nm is formed.

An application example of the quantum dot structure having the above-described structure will be described below.

A first constitution example of the quantum dot semiconductor device will be first described.

Figure 4:
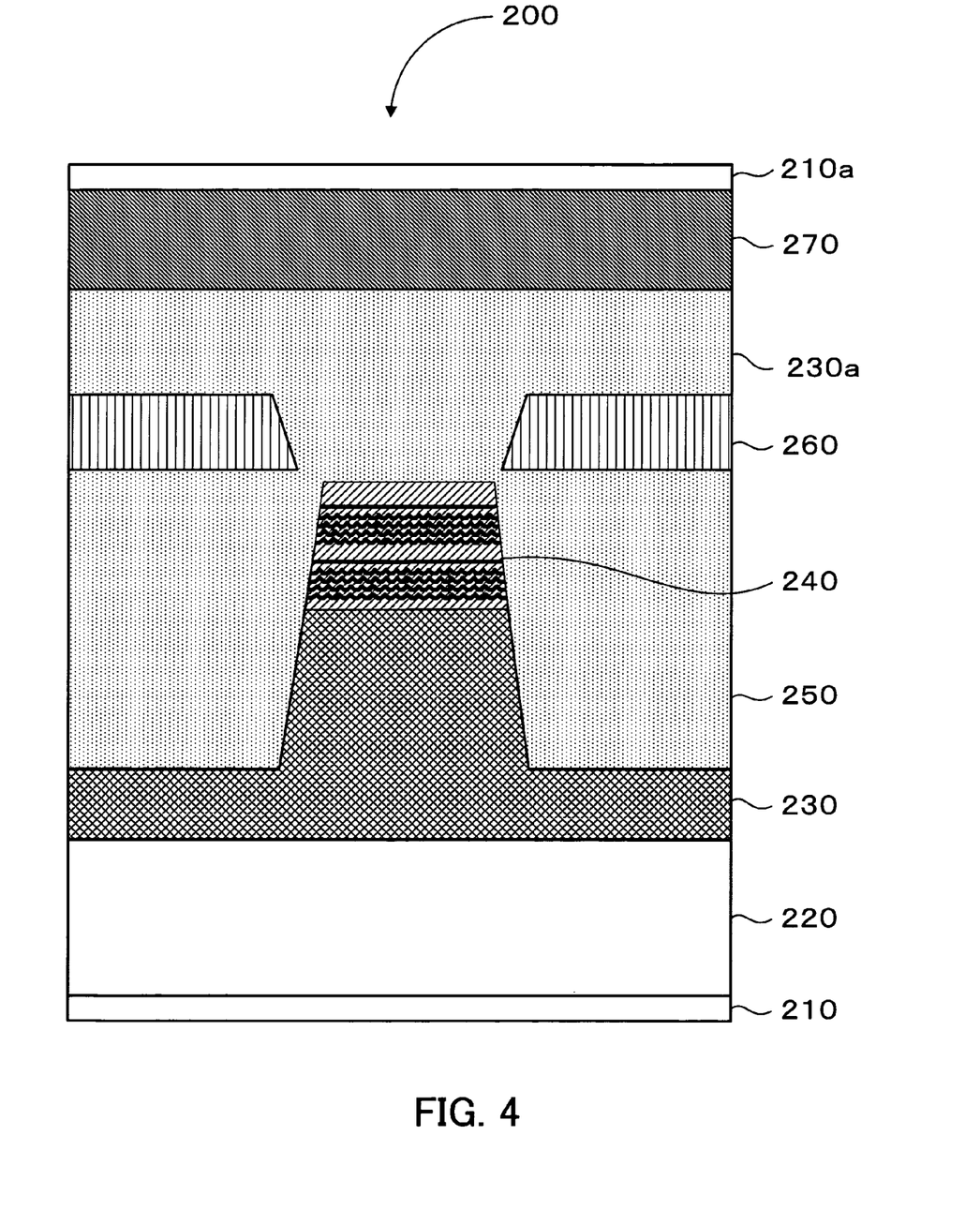
FIG. 4 is a first constitution example of a quantum dot semiconductor device.

FIG. 4 is the first constitution example of the quantum dot semiconductor device. An embedded semiconductor optical amplifier 200 with the columnar quantum dot in FIG. 4 has the following structure. On an InP substrate 220, an n-InP cladding layer 230 is disposed in the shape of a mesa and a stacked columnar quantum dot structure 240 is mounted on the layer 230. The n-InP cladding layer 230 and an n-InP block layer 260 are covered with a p-InP embedding layer 250, and a p-InGaAs contact layer 270 is stacked on the p-InP embedding layer 250. The first constitution example can be manufactured, for example, as follows. On the InP substrate 220, the n-InP cladding layer 230 is epitaxially grown to a thickness of, for example, 300 to 500 nm. The n-type impurity concentration of the layer 230 is, for example, $5 \times 10^{17}$ cm$^{-3}$. On the n-InP cladding layer 230, the stacked columnar quantum dot structure 240 shown in a constitution example of the quantum dot structure is formed as an active layer. Thereafter, a mesa is formed by lithography and etching. After growing the p-InP embedding layer 250 so as to embed the mesa, the n-InP block layer 260 is formed. Thereafter, a p-InP cladding layer 230*a* is grown to a thickness of, for example, 2 to 3 μm. The impurity concentration of the p-InP cladding layer 230*a* is, for example, $1 \times 10^{18}$ cm$^{-3}$. On the p-InP cladding layer 230*a*, a p-InGaAs contact layer 270 is grown. The impurity concentration of the layer 270 is, for example, $1 \times 10^{19}$ cm$^{-3}$. Thereafter, an n-side electrode 210 and a p-side electrode 210*a* are formed. On an axial end face from which light exits, a cavity is formed by cleavage. Further, an antireflection film is formed on each end face of the cavity.

Next, a second application example of the quantum dot semiconductor device will be described.

Figure 5:
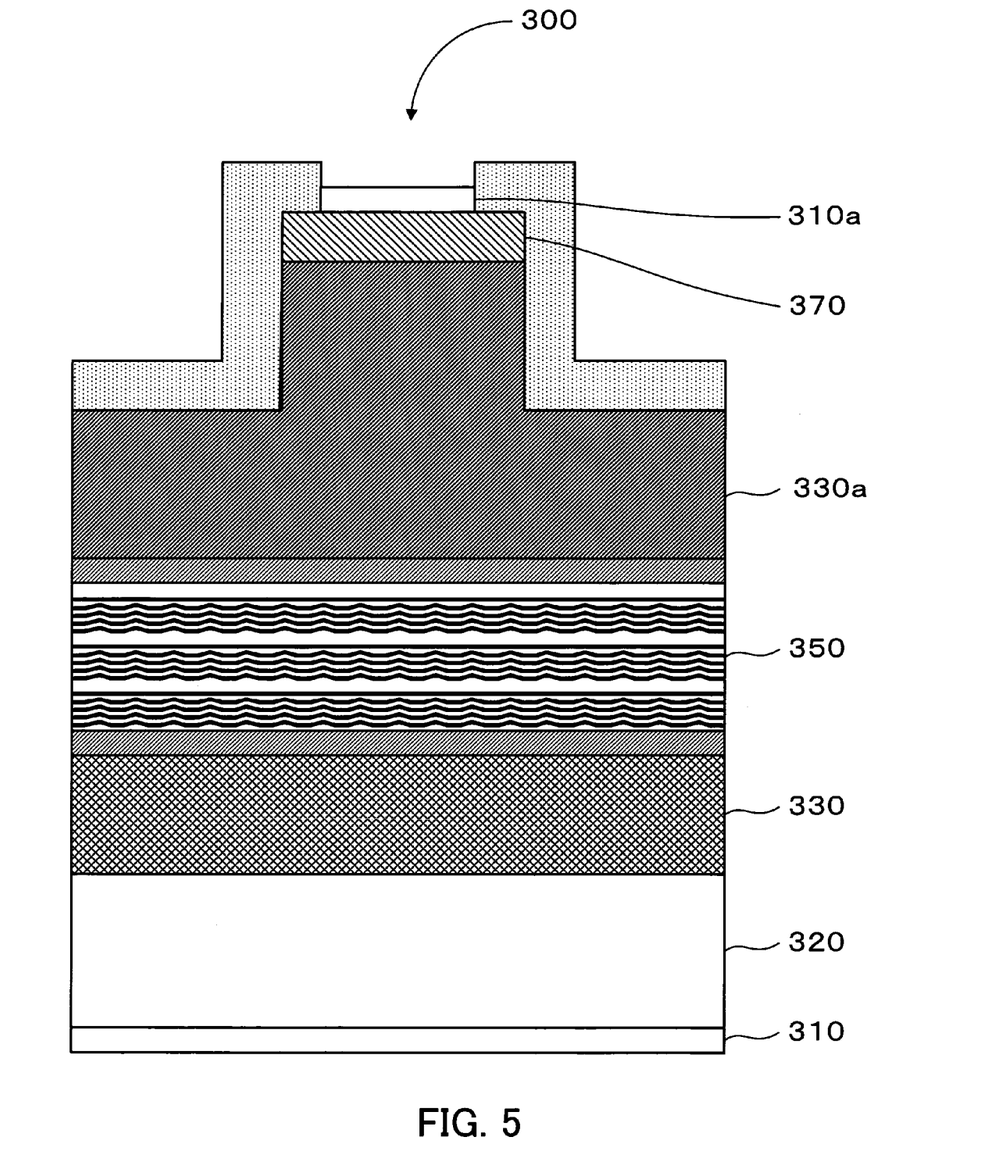
FIG. 5 is a second constitution example of a quantum dot semiconductor device.

FIG. 5 is the second constitution example of the quantum dot semiconductor device. FIG. 5 shows a ridge semiconductor optical amplifier 300 with the columnar quantum dot. The amplifier 300 has the following structure. On an n-InP substrate 320, an n-InP cladding layer 330 is stacked, and a stacked columnar quantum dot structure 350 is mounted on the layer 330. Subsequently, a p-InP cladding layer 330*a* and a p-InGaAs contact layer 370 are stacked. The second constitution example can be manufactured, for example, as follows. On the n-InP substrate 320, the n-InP cladding layer 330, the stacked columnar quantum dot structure 350, the p-InP cladding layer 330*a* and the p-InGaAs contact layer 370 are grown. Then, a mesa is formed by lithography and etching. Thereafter, an n-side electrode 310 and a p-side electrode 310*a* are formed. On an axial end face from which light exits, a cavity is formed by cleavage. Further, an antireflection film is formed on each end face of the cavity.

In the above two application examples, the semiconductor optical amplifiers having the present invention are manufactured, so that sufficient gains can be secured for the light with a variable polarized wave direction.

These application examples show structures of typical embedded and ridge semiconductor optical amplifiers. Further, the manufacturing method and constitution of other parts excluding the active layer part may be other known manufacturing method and constitution.

In the present invention, on the quantum dot layer as an uppermost layer of the multilayer quantum dot, the third barrier layer which keeps local strains in the quantum dot layer is formed and further, the fourth barrier layer which compensates residual strains in the multilayer quantum dot is formed on the third barrier layer. Therefore, a quantum dot semiconductor device securing sufficient gains without depending on polarization can be realized.

Further, in the present invention, the method comprises, after the formation of a multilayer quantum dot, the steps of: forming on a quantum dot layer as an uppermost layer of the formed multilayer quantum dot a third barrier layer which keeps local strains in the quantum dot layer as the uppermost layer of the multilayer quantum dot; and forming on the formed third barrier layer a fourth barrier layer which compensates residual strains in the multilayer quantum dot. Therefore, a quantum dot semiconductor device capable of keeping high crystallinity and securing sufficient gains without depending on polarization can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A quantum dot semiconductor device, comprising:
   a semiconductor substrate; and
   a quantum dot structure formed over the substrate,
   the quantum dot structure comprising:
   a multilayer quantum dot formed on a first barrier layer, the multilayer quantum dot including quantum dot layers and a second barrier layer formed between the quantum dot layers;
   a third barrier layer formed on an uppermost layer of the quantum dot layers, which keeps local strains in the uppermost layer; and
   a fourth barrier layer formed on the third barrier layer, which compensates for residual strains in the multilayer quantum dot, the fourth barrier layer having strains larger than strains of the first barrier layer,
   wherein materials with a same band gap are used for the third and the fourth barrier layers, and
   the second barrier layer is a layer having tensile strains, and the third barrier layer is a layer having compressive strains.

2. The semiconductor device according to claim 1, wherein the third barrier layer is formed to cover the quantum dot layer as the uppermost layer.

3. The semiconductor device according to claim 1, wherein the fourth barrier layer is a layer having tensile strains.

4. The semiconductor device according to claim 1, wherein the second barrier layer has a film thickness that the quantum dot layers for sandwiching the second barrier layer are connected quantum mechanically.

5. The semiconductor device according to claim 1, wherein a plurality of the quantum dot structures are stacked.

6. The semiconductor device according to claim 1, wherein an evaluation result of residual strain energy in the quantum dot structure is 0.62 nm or less.

7. The semiconductor device according to claim 1, wherein at least one layer of the quantum dot structures is sandwiched between a first cladding layer formed on the first barrier layer side and a second cladding layer formed on the fourth barrier layer side.

8. The semiconductor device according to claim 7, wherein a mesa formed in a stacked structure composed of the first cladding layer and the at least one layer of the quantum dot structures is embedded by the second cladding layer.

9. The semiconductor device according to claim 7, wherein a mesa is formed in the second cladding layer in a stacked structure composed of the first cladding layer, the at least one layer of the quantum dot structures and the second cladding layer.

10. The semiconductor device according to claim 1, wherein a material composition of the second barrier layer is different from a material composition of the barrier layer.

11. The semiconductor device according to claim 1, wherein the second barrier layer is $In_xGa_{1-x}As_{1-y}P_y$ material with $x=0.66$ and $y=0.56$, and the third barrier layer is $In_xGa_{1-x}As_{1-y}P_y$ material with $x=0.85$ and $y=0.67$.

* * * * *